United States Patent
Takeuchi et al.

(10) Patent No.: US 8,677,217 B2
(45) Date of Patent: Mar. 18, 2014

(54) DATA INPUT / OUTPUT CONTROL DEVICE AND SEMICONDUCTOR MEMORY DEVICE SYSTEM

(75) Inventors: Ken Takeuchi, Tokyo (JP); Shuhei Tanakamaru, Tokyo (JP)

(73) Assignee: The University of Tokyo, Tokyo (JP)

( * ) Notice: Subject to any disclaimer, the term of this patent is extended or adjusted under 35 U.S.C. 154(b) by 531 days.

(21) Appl. No.: 13/087,035

(22) Filed: Apr. 14, 2011

(65) Prior Publication Data
US 2011/0289385 A1 Nov. 24, 2011

(30) Foreign Application Priority Data

Apr. 28, 2010 (JP) ................................. 2010-104007

(51) Int. Cl.
*G11C 29/00* (2006.01)
(52) U.S. Cl.
USPC ........................................................ 714/764
(58) Field of Classification Search
USPC ........................................................ 714/764
See application file for complete search history.

(56) References Cited

U.S. PATENT DOCUMENTS

| | | | | |
|---|---|---|---|---|
| 5,127,014 | A * | 6/1992 | Raynham | ...................... 714/754 |
| 2003/0101405 | A1 | 5/2003 | Shibata | |
| 2004/0083333 | A1 | 4/2004 | Chang et al. | |
| 2007/0279264 | A1 * | 12/2007 | Nakagawa | ....................... 341/55 |
| 2009/0210772 | A1 * | 8/2009 | Noguchi | ....................... 714/764 |

FOREIGN PATENT DOCUMENTS

| | | |
|---|---|---|
| JP | S-52-76838 | 6/1977 |
| JP | A-2003-157697 | 5/2003 |
| JP | A-2004-164634 | 6/2004 |

OTHER PUBLICATIONS

Tanzawa et al., "A Compact-On-Chip ECC for Low Cost Flash Memories," *IEEE Journal of Solid-State Circuits*, 1997, pp. 662-669, vol. 32, No. 5.
Statement of Relevance regarding JP S52-76838.

* cited by examiner

*Primary Examiner* — Albert Decady
*Assistant Examiner* — Enam Ahmed
(74) *Attorney, Agent, or Firm* — Oliff PLC

(57) ABSTRACT

When detected number of errors data Nerror exceeds the upper limit number of errors Nmax, an error correction circuit of a memory controller stores twice as long data length as stored data length for execution Sdata as the data length for execution Sdata in a correction information memory unit, and code length Scref longer than the data length for execution Sdata and detectable more errors than the upper limit number of errors as the code length for execution Scode in the correction information memory unit 32 (step S100 and S110). The error correction circuit encodes input data using BCH code having the stored code length for execution Scode, stored encoded data in a semiconductor memory device, is input data stored in the semiconductor memory device, performs error correction for input data using BCH code, and decode error corrected data.

24 Claims, 5 Drawing Sheets

DATA INPUT / OUTPUT CONTROL DEVICE AND SEMICONDUCTOR MEMORY DEVICE SYSTEM

BACKGROUND OF THE INVENTION

1. Field of the Invention

The present invention relates to a data input/output control device and a semiconductor memory device system, for details, a data input/output control device configured to encode data input from a host device into predetermined error correcting code to store the encoded data in a nonvolatile semiconductor memory device, input the stored data in the nonvolatile semiconductor memory device, perform error correction and decoding on input_data using the predetermined error correcting code, and output the decoded data to the host device, and a semiconductor memory device system comprising a nonvolatile semiconductor memory device and the data input/output control device.

2. Field of the Invention

A proposed structure of a data input/output control device controlling a flash memory in response to a request from CPU has an error correction circuit reading an input data sequentially in 512 Byte, encodes the read data into error correcting code having 522 byte, writing the encoded data into the flash memory, performing error correction, encoding the data to be read out, and outputting the encoded data when the data is read out from the flash memory (see, for example, Non-Patent Document 1). This proposed data input/output control device has this error correction circuit, and successively correct data inversion errors when the data inversion error in the data stored in the flash memory occurs owing to some reason. Non-Patent Document 1: Toru Tanzawa, Tomoharu Tanaka, Ken Takeuchi, Riichiro Shirota, Seiichi Aritomo, Hiroshi Watanabe, Gertjan Hemink, Kazuhiro Shimizu, Shinji Sato, Yuji Takeuchi, and Kazunori Ohuchi, "A Compact On-Chip ECC for Low Cost Flash Memories", IEEE JOURNAL OF SOLID-STATE CIRCUITS, VOL. 32, No. 5, MAY 1997.

In this prior art data input/output control device, code length of error correcting code is set predetermined length, and error correction of data is performed using error correcting code having the predetermined length. There is an upper limit in number of bits that is correctable. When the errors more than the upper limit of number of bits that is correctable occurs, this errors cannot be corrected. The one of the methods for correcting more error is the method of using error correcting code having longer code length. In this case, the time for encoding or decoding data in the error correction circuit increases, and consumption power of the error correction circuit increases.

SUMMARY OF THE INVENTION

In a data input/output control devices and a semiconductor memory device system, there would thus be a demand for correcting more errors when the errors occur in the data stored in a semiconductor memory device.

The present invention accomplishes at least part of the demand mentioned above and the other relevant demands by the following configurations applied to the data input/output control devices and the semiconductor memory device system.

According to one aspect, the present invention is directed to a data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device. The data input/output control device has: a data correction input/output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; an error detecting unit configured to read input data sequentially in the stored code length for execution and detect number of erroneous data in the read n (n is an integer greater than or equal to 1) pieces of data using the predetermined error correcting code; and a memory processing unit configured to store length of data that is longer than the data length for execution as the data length for execution in the error correction information memory unit and code length of the predetermined error correcting code as the code length for execution in the error correction information memory unit, the length of data and the code length of the predetermined error correcting code correcting and detecting more errors than an upper limit number of errors that is correctable and detectable using one predetermined error correcting code with the code length for execution when the detected number of erroneous data exceeds a predefined upper limit number of errors; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit and the data output from the decoding unit of the data correction input/output circuit is output to the host device when a read out request signal requesting to read out data stored in the semiconductor memory device is input from the host device, and control the data correction input/output circuit and the semiconductor memory device such that the data stored in the semiconductor memory device is read out to be erased after the data read out is input into the error detection unit of the data correction input/output circuit when an erase request signal requesting to erase data stored in the semiconductor memory device is input from the host device.

In the control device of the semiconductor memory device according to this aspect of the invention, the control circuit controls the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device. The encoding unit of the data correction input/output circuit reads input data sequentially in the stored data length for execution, encodes the read data into the predetermined error correcting code having the code length for execution, and outputs the encoded data to the semiconductor memory device. Thus storing the data encoded into the predetermined error correcting code having the code length for execution to the semiconductor memory device is accomplished. The control circuit controls the data correction input/output circuit and the semiconductor memory device such that the data stored in the semiconductor device is read out to be input into the decoding unit of the data correction input/output circuit and the data output from the decoding unit of the data correction input/output circuit is output to the host device when the read out request signal requesting to read out data stored in the semiconductor memory device is input from the host device. The decoding unit reads input data sequentially in the stored data length for execution, performs error correction and decoding on the read data using the predetermined error correcting code, and outputs the decoded data to the host device. Thus the output of the error-corrected data to the host device is accomplished. The control circuit controls the data correction input/output circuit and the semiconductor memory device such that the data stored in the semiconductor memory device is read out to be erased after the data read out is input into the error detection unit of the data correction input/output circuit when the erase request signal requesting to erase data stored in the semiconductor memory device is input from the host device. The error detecting unit reads input data sequentially in the stored code length for execution and detect number of erroneous data in the read n (n is an integer greater than or equal to 1) pieces of data using the predetermined error correcting code. The memory processing unit stores length of data that is longer than the data length for execution as the data length for execution in the error correction information memory unit and code length of the predetermined error correcting code as the code length for execution in the error correction information memory unit when the detected number of erroneous data exceeds a predefined upper limit number of errors. The length of data and the code length of the predetermined error correcting code are set to be correctable and detectable more errors than an upper limit number of errors that is correctable and detectable using one predetermined error correcting code with the code length for execution. When the detected number of erroneous data exceeds the upper limit number of errors, in response to inputting of next write request signal, the encoding unit of the data correction input/output circuit reads input data sequentially in longer data length for execution, encodes the read data into the predetermined error correcting code having longer code length for execution, and outputs the encoded data to the semiconductor memory device. When the next read out request signal is input, the decoding unit performs error correction on the read data using longer predetermined error correcting code. Thus correcting more errors is accomplished. The upper limit number of errors includes an upper limit value of number of errors that is correctable and detectable using n predetermined error correcting codes with the code length for execution or a value slight lower than the upper limit value of number of errors.

In one preferable application of the data input/output control device according to the above aspect of the invention, the memory processing unit of the data correction input/output circuit is configured to store length of data that is m (m is an integer greater than or equal to 2) times the stored data length for execution in the error correction information memory unit as the data length for execution when number of the detected errors exceeds the upper limit number of errors.

According to another aspect, the present invention is directed to a data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device. The data input/output control device has: a counting number of write times circuit configured to count number of write-erase times that is a sum of number of times writing data to the semiconductor memory device and number of times erasing data stored in the semiconductor memory device; a data correction input and output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; and a are unit configured to store length of data as the data length for execution in the error correction information memory unit and code length of the predetermined error correcting code as the code length for execution in the error correction information when the counted number of write and erase times exceeds a threshold for judgment assumed that more error than the predefined upper limit number of errors are generated in n (n is an integer greater than or equal to 1) pieces of data having the code length for execution, the length of data and the code length of the predetermined error correcting code set to be correctable and detectable more errors than an upper limit number of errors that is corrected detected using one predetermined error correcting code having the code length for execution; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit and the data output from the decoding unit of the data correction input/output circuit is output to the host device when a read out request signal requesting to read out data stored in the semiconductor memory device is input from the host device, and control the semiconductor memory device such that the data stored in the semiconductor memory device is erased when an erase request signal requesting to erase data stored in the semiconductor memory device is input from the host device.

In the data input/output control device according to this aspect of the invention, the control circuit controls the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device. The encoding unit of the data correction input/output circuit reads input data sequentially in the stored data length for execution, encodes the read data into the predetermined error correcting code having the code length for execution, and outputs the encoded data to the semiconductor memory device. Thus storing the data encoded into the predetermined error correcting code having the code length for execution to the semiconductor memory device is accomplished. The control circuit controls the data correction input/output circuit and the semiconductor memory device such that the data stored in the semiconductor device is read out to be input into the decoding unit of the data correction input/output circuit and the data output from the decoding unit of the data correction input/output circuit is output to the host device when the read out request signal requesting to read out data stored in the semiconductor memory device is input from the host device. The decoding unit reads input data sequentially in the stored data length for execution, performs error correction and decoding on the read data using the predetermined error correcting code, and outputs the decoded data to the host device. Thus the output of the error-corrected data to the host device is accomplished. The memory processing unit stores length of data as the data length for execution in the error correction information memory unit and code length of the predetermined error correcting code as the code length for execution in the error correction information when the counted number of write and erase times exceeds a threshold for judgment assumed that more error than the predefined upper limit number of errors are generated in n (n is an integer greater than or equal to 1) pieces of data having the code length for execution. The length of data and the code length of the predetermined error correcting code are set to be correctable and detectable more errors than an upper limit number of errors that is corrected and detected using one predetermined error correcting code having the code length for execution. When the counted number of write and erase times exceeds the threshold for judgment, in response to inputting of next write request signal, the encoding unit of the data correction input/output circuit reads input data sequentially in longer data length for execution, encodes the read data into the predetermined error correcting code having longer code length for execution, and outputs the encoded data to the semiconductor memory device. When the next read out request signal is input, the decoding unit performs error correction on the read data using longer predetermined error correcting code. Thus correcting more errors is accomplished. The upper limit number of errors includes an upper limit value of number of errors that is correctable and detectable using n predetermined error correcting codes with the code length for execution or a value slight lower than the upper limit value of number of errors.

In another preferable application of the data input/output control device according to the above aspect of the invention, the memory processing unit of the data correction input/output circuit is configured to store length of data that is m (m is an integer greater than or equal to 2) times the stored data length for execution in the error correction information memory unit as the data length for execution when number of the counted number of write-erase times exceeds the threshold.

In another preferable application of the data input/output control device according to the above aspect of the invention, the memory processing unit of the data correction input/output circuit is configured to store the data length for execution and the code length for execution set such that the code length for execution stored in the error correction information memory unit is shorter than a predefined upper limit power allowable code length. The predefined upper limit power allowable code length is an upper limit of the code length for execution that makes power consumed by the data correction input/output circuit lower than or equal to allowable power allowed in the data correction input/output circuit. The longer the code length for execution stored in the error correction information memory unit is, the larger the power consumed by the data correction input/output circuit tends to be. Storing the data length for execution and the code length for execution set such that the code length for execution stored in the error correction information memory unit is shorter than the predefined upper limit power allowable code length, the error correction is accomplished with the power consumed by the data correction input/output circuit lower than the allowable power.

In one preferable application of the data input/output control device according to the above aspect of the invention, the memory processing unit of the data correction input/output circuit is configured to store the data length for execution and the code length for execution set such that the code length for execution stored in the error correction information memory unit is shorter than a predefined upper limit speed allowable code length, the predefined upper limit speed allowable code length being an upper limit of the code length for execution that makes read out speed lower than or equal to allowable read out speed allowed in the data correction input/output circuit, the read out speed being amount of data that the data correction input/output circuit reads out from the semiconductor memory device per unit time. The longer the code length for execution stored in the error correction information memory unit is, the shorter the read out speed tends to be. Storing the data length for execution and the code length for execution set such that the code length for execution stored in the error correction information memory unit is shorter than the predefined upper limit speed allowable code length, the error correction is accomplished with the read out speed of the data correction input/output circuit later than allowable read out speed.

In another preferable application of the data input/output control device according to the above aspect of the invention, the memory processing unit of the data correction input/output circuit is configured to store the data length for execution and the code length for execution set such that the code length for execution stored in the error correction information memory unit is shorter than a predefined upper limit area allowable code length. The predefined upper limit area allowable is an upper limit of the code length for execution that makes area of the data correction input/output circuit smaller than or equal to allowable area allowed in the data correction input/output circuit. The longer the code length for execution stored in the error correction information memory unit is, the larger the area of the data correction input/output circuit tends to be. Storing the data length for execution and the code length for execution set such that the code length for execution stored in the error correction information memory unit is shorter than a predefined upper limit area allowable code length, the error correction is accomplished with the area of the data correction input/output circuit smaller than or equal to allowable area.

In one preferable application of the data input/output control device according to the above aspect of the invention, the semiconductor memory device comprises a plurality of semiconductor memory elements that store a plurality of electron injection states as multilevel storage based on amount of electrons injected to floating gates and have disposition of facilitating degradation with growth of amount of electrons injected to the floating gates, the data correction input/output circuit comprises a data conversion unit configured to read the input data sequentially in a first length, append a first flag having second length to the input data and output the appended data to the encoding unit when number of high electron injection data of the read data having the first length is less than or equal to number of low electron injection data, perform data conversion that converts the high electron injection data into the low electron injection data and the low electron injection data into the high electron injection data and append the converted data to a second flag having the second length to output the appended data to the encoding unit when the number of high electron injection data of the read data having the first length is more than number of low electron injection data, read the output data from the decoded unit sequentially in a third length that is a sum of the first length and the second length, output data that is obtained by deleting the first flag from the read data having the third length when the read data having the third length includes the first flag, and perform the data conversion to data that is obtained by deleting the second flag from the read data having the third length and output the converted data when the read data having the third length includes the second flag, the high electron injection data sets the semiconductor memory elements in a state that amount of electrons injected to the floating gates is more than the amount of electrons injected to the floating gates in predetermined electron injection state, and the low electron injection data sets the semiconductor memory elements in a state that the amount of electrons injected to the floating gates is less than the amount of electrons injected to the floating gates in the predetermined high electron injection state, and the control circuit is configured to control the data correction input/output circuit and the semiconductor memory device such that data input from the host device is input into the encoding unit of the data correction input/output circuit via the data conversion unit of the data correction input/output circuit when the write request signal is input from the host device, and control the data correction input/output circuit and the semiconductor memory device such that the data output from the decoding unit of the data correction input/output circuit is output to the host device via the data conversion unit of the data correction input/output circuit when the read out request signal is input from the host device. This arrangement makes ratio of low electron injection data higher than that of high electron injection data. Lower probability of occurrence of the error in the semiconductor memory device is accomplished. In this case, the semiconductor memory element stores the high electron injection state that is a state with electron injected to the floating gate and the low electron injection state that is a state with less electron than that of high electron injection state injected to the floating gate as two-valued storage, the high electron injection data makes the semiconductor elements as the high electron injection state, and the low electron injection data makes the semiconductor elements as the low electron injection state. In case that the semiconductor memory element stores the high electron injection state and the low electron injection state as two-valued storage, lower probability of occurrence of the error in the semiconductor memory device is accomplished.

In another preferable application of the data input/output control device according to the above aspect of the invention, specified error correcting code is block code or convolutional code. In this aspect of the invention, the block code includes BCH code, Reed-Solomon code, and so on. The convolutional code includes LDPC code and so on.

In one preferable application of the data input/output control device according to the above aspect of the invention, the semiconductor memory device has such a deposition that probability that error occurs in the stored data increase with number of read-erase times, the read-erase times is a sum of number of times of writing data to the semiconductor memory device and number of times of erasing data stored in the semiconductor device. In this aspect of the invention, the semiconductor memory device is any one of NAND type flash memory, NOR type flash memory, phase change memory, magnetic memory, ferroelectric memory and resistive change memory, or combination thereof.

In another preferable application of the data input/output control device according to the above aspect of the invention, the semiconductor memory device is formed on a semiconductor chip different from a semiconductor chip that the data input/output control device is formed. In case that the semiconductor memory device is formed on the chip different from the semiconductor chip that the data input/output control device is formed, the collection of more error is accomplished.

According to one aspect, the present invention is directed to a semiconductor memory device system comprising a nonvolatile semiconductor memory device; and a data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device, data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device. The data input/output control device comprising: a data correction input/output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; an error detecting unit configured to read input data sequentially in the stored code length for execution and detect number of erroneous data in the read n (n is an integer greater than or equal to 1) pieces of data using the predetermined error correcting code; and a memory processing unit configured to store length of data that is longer than the data length for execution as the data length for execution in the error correction information memory unit and code length of the predetermined error correcting code as the code length for execution in the error correction information memory unit, the length of data and the code length of the predetermined error correcting code correcting and detecting more errors than an upper limit number of errors that is correctable and detectable using one predetermined error correcting code with the code length for execution when the detected number of erroneous data exceeds a predefined upper limit number of error; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit and the data output from the decoding unit of the data correction input/output circuit is output to the host device when a read out request signal requesting to read out data stored in the semiconductor memory device is input from the host device, and control the data correction input/output circuit and the semiconductor memory device such that the data stored in the semiconductor memory device is read out to be erased after the data read out is input into the error detection unit of the data correction input/output circuit when an erase request signal requesting to erase data stored in the semiconductor memory device is input from the host device. According to another aspect, the data input/output control device comprising: a counting number of write times circuit configured to count number of write-erase times that is a sum of number of times writing data to the semiconductor memory device and number of times erasing data stored in the semiconductor memory device; a data correction input and output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; and a memory processing unit configured to store length of data as the data length for execution in the error correction information memory unit and code length of the predetermined error correcting code as the code length for execution in the error correction information when the counted number of write and erase times exceeds a threshold for judgment assumed that more error than the predefined upper limit number of errors are generated in n (n is an integer greater than or equal to 1) pieces of data having the code length for execution, the length of data and the code length of the predetermined error correcting code being correctable and detectable more errors than an upper limit number of errors that is corrected detected using one predetermined error correcting code having the code length for execution; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit and the data output from the decoding unit of the data correction input/output circuit is output to the host device when a read out request signal requesting to read out data stored in the semiconductor memory device is input from the host device, and control the semiconductor memory device such that the data stored in the semiconductor memory device is erased when an erase request signal requesting to erase data stored in the semiconductor memory device is input from the host device.

In the semiconductor memory device system according to this aspect of the invention, the semiconductor memory device system has the data input/output control device according to the above aspect of the invention. The present invention accomplishes at any one part of the demand mentioned above by the following configurations applied to the data input/output control devices, for example, the demand of correcting more errors.

In one preferable application of the semiconductor memory device system according to the above aspect of the invention, the semiconductor memory device has such a deposition that probability that error occurs in the stored data increase with number of read-erase times, the read-erase times is a sum of number of times of writing data to the semiconductor memory device and number of times of erasing data stored in the semiconductor device. In this aspect of the invention, the semiconductor memory device is anyone of NAND type flash memory, NOR type flash memory, phase change memory, magnetic memory, ferroelectric memory and resistive memory, or combination thereof.

In another preferable application of the semiconductor memory device system according to the above aspect of the invention, the semiconductor memory device is formed on a semiconductor chip different from a semiconductor chip that the data input/output control device is formed. In case that the semiconductor memory device is formed on the chip different from the semiconductor chip that the data input/output control device is formed, the collection of more error is accomplished.

DESCRIPTION OF THE PREFERRED EMBODIMENTS

One mode of carrying out the invention is described below as a preferred embodiment.

Figure 1:
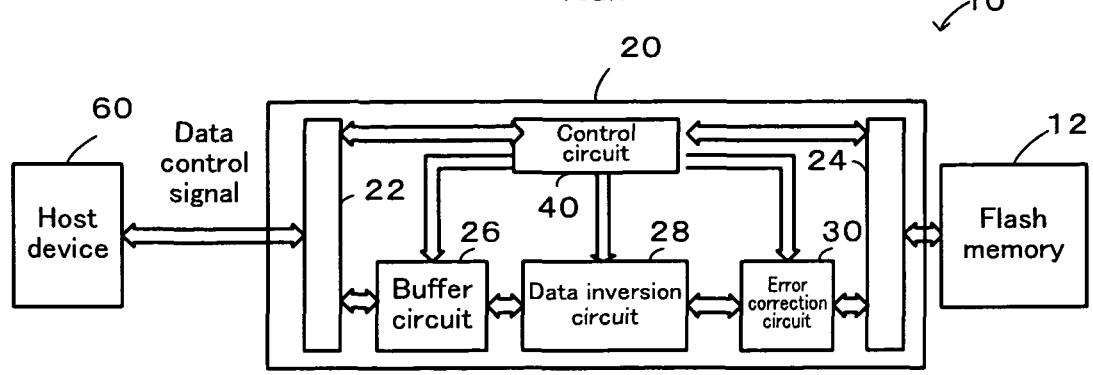
FIG. 1 schematically illustrates one configuration of a flash memory system 10 having a data input/output control device.

FIG. 1 schematically illustrates one configuration of a flash memory system 10 having a data input/output control device. The flash memory system 10 has a flash memory 12 structured by stacking a plurality of silicon chips formed NAND type flash memory, a memory controller 20 controlling the flash memory 12. The flash memory system 10 is connected to communicate with a host device 60 (for example, personal computer and so on), stores data input from the host device 60 in the flash memory 12 or output the stored data to the host device 60. The flash memory 12 is to be formed on semiconductor chip that is different from semiconductor chip that the memory controller 20 is formed on.

The flash memory 12 is configured as NAND type flash memory having flash memory cell array (not illustrated) that has a plurality of flash memory cells that a threshold voltage varies by electrons injection into a floating gate or by drawing electrons away from the floating gate. In addition to the flash memory cell array, the flash memory 12 has Law decoder, column decoder, sense amplifier and so on (all not illustrated). In the flash memory 12, data is written or read out in a page (in this embodiment, one page corresponds to (512 byte+104 bit)), and the stored data is erased in a block (in this embodiment, one block corresponds to 64 page). In electrons injected into the floating gate, data stored in the flash memory cell is to be "0". In electrons drawn away from the floating gate and electrons in the floating gate less than when data stored in the flash memory cell is "0", data stored in the flash memory cell is to be "1".

The memory controller 20 is configured to be a logic circuit having a plurality of logic element, for example, transistor. The memory controller 20 have a host interface circuit 22 outputting control signals from the host 60, inputting data from the host device 60 and outputting data to the host device 60, a memory interface circuit 24 outputting control signals to flash memory 12, inputting data from the flash memory 12, and outputting data to the flash memory 12, a buffer circuit 26 temporally storing data input the host interface circuit 22, a data inversion circuit 28 reading out data from the buffer circuit 26, inversing or not inversing data based on number of "1" data included in the stored data, adding a not inversion flag or conversion flag and outputting the added data, a error correction circuit 30 encoding data from the data inversion circuit 28 using BCH (Bose-Chaudfuri-Hocquenghem) code, outputting encoded data to the memory interface circuit 24, decoding the data from the memory interface circuit 24 and outputting decoded data to the data inversion circuit, and a control circuit 40 controlling the operation of the entire memory controller 20.

Figure 2:
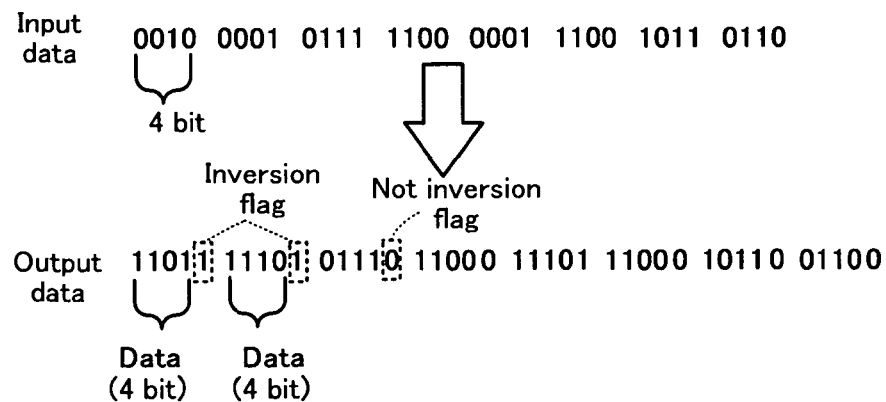
FIG. 2 schematically illustrates data output from a data inversion circuit 28 in response to data input in the data inversion circuit 28.

The data inversion circuit 28 reads data sequentially in 4 bit from the buffer circuit 26. When number of data of "0" is more than number of data of "1" in 4 bit read data, the data inversion circuit 28 performs bit inversion that inverts data of "1" to data of "0" and inverts data of "0" to data of "1", adds inversion flag of "1" showing to perform bit inversion to the inverted data, and outputs the added data to the error correction circuit 30. When the number of data of "0" is less than or equal to the number of data of "1" in 4 bit read data, the data inversion circuit 28 adds not-inversion flag of "0" showing not to perform bit inversion to the read data without performing bit inversion, and outputs the added data to the error correction circuit 30. FIG. 2 schematically illustrates data output from a data inversion circuit 28 in response to data input in the data inversion circuit 28. The data inversion circuit 28 reads data sequentially in 5 bit from the error correction circuit 30. When the read data includes the inversion flag, the data inversion circuit 28 deletes the inversion flag from the read data, performs bit inversion to the deleted 4 bit data, and outputs the inverted data to the buffer circuit 26. When the read data includes the not-inversion flag, the data inversion circuit 28 deletes the not-inversion flag from the read data, and outputs the deleted data to the buffer circuit 26. These operations makes ratio of data of "1" in data output from the data inversion circuit 28 to the error correction circuit 30 increased. The reason for performing this operation is described below. In the flash memory cell, when the electrons are injected in the floating gate, gate insulator film deteriorates in stress given when the electrons pass through the gate insulator film. The more data of "0" is included, the higher possibility of generation of error in the data stored in the flash memory cell is seems to be. In data retention, error is occurred owing to leak of electron injected in the floating gate. The more data of "0" is included, the higher possibility of generation of error in the data stored in the flash memory cell is seems to be. The possibility of generation of error with data of "1" stored in the flash memory cell is less than that of error with data of "0" stored in the flash memory cell. The data inversion circuit 28 accomplishes to lower the possibility of generation of error stored in the flash memory 12.

Figure 3:
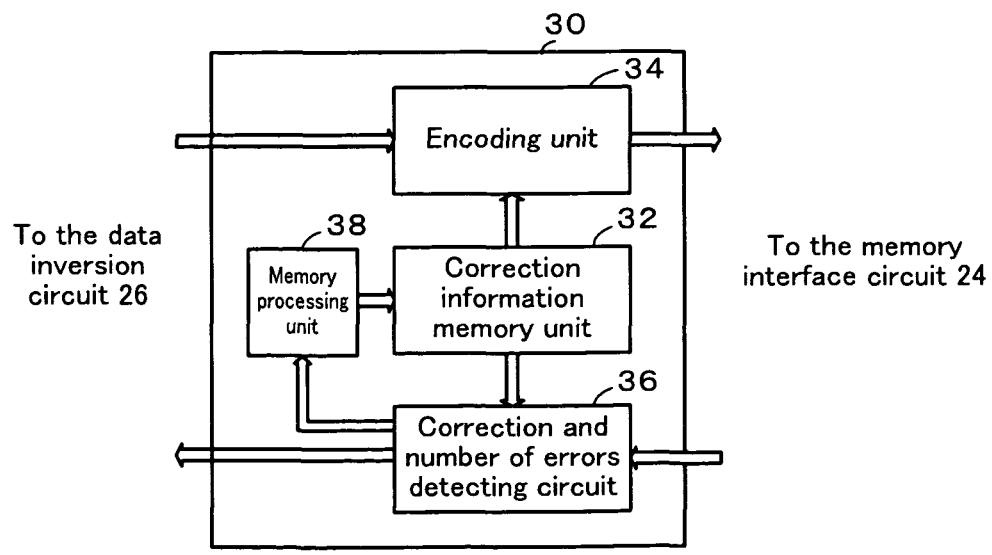
FIG. 3 schematically illustrates the configuration of an error correction circuit 30.

FIG. 3 schematically illustrates the configuration of an error correction circuit 30. The error correction circuit 30 is configured to be a logic circuit having a plurality of logic element, for example, transistor. The error correction circuit 30 has a correction information memory unit 32 storing code length for execution Scode that is size of BCH code using encoding and decoding data and data length for execution Sdata that is size of data encoded using BCH code of the code length for execution Scode, an encoding unit 34 encoding the data input from data inversion circuit 28 into BCH code having the code length for execution Scode stored in the correction information memory unit 32 and outputting the encoded data, a decode and number of errors detection unit 36 decoding data input from the flash memory 12 using BCH code having the code length for execution Scode, outputting the encoded data and detecting number of errors data of data input from the flash memory 12, a memory processing unit 38 changing the code length for execution Scode and the data length for execution stored in the correction information memory unit 32.

Figure 4:
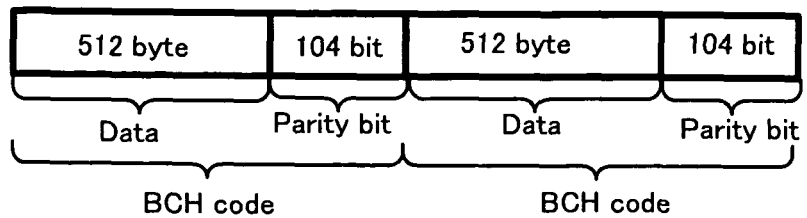
FIG. 4 schematically illustrates data structure output from an encoding unit 34 when data length for execution is 512 byte and code length for execution is (512K byte+104 bit).

The encoding unit 34 reads the input data from the data inversion circuit 28 in the data length for execution Sdata stored in the correction information memory unit 32, generates parity bit to be added for encoding the read data having the data length for execution Sdata to the BCH code having the code length for execution Scode by arithmetic processing using generation polynomial of the BCH code, and outputs data obtained by adding the generated parity bit to the read data having the data length for execution Sdata to the memory interface circuit 24. FIG. 4 schematically illustrates data structure output from an encoding unit 34 when data length for execution is 512 byte and code length for execution is (512K byte+104 bit). The arithmetic processing using generation polynomial of the BCH code is widely known. A detailed explanation about processing using generation polynomial of the BCH code is abbreviated.

The decoding and number of errors detecting unit 36 reads the input data from the flash memory 12 via the memory interface circuit 24 in the code length for execution Sdata stored in the correction information memory unit 32, detects bit position where bit error occurs by syndromes calculation for the read data having the code length for execution Scode using generation polynomial of the BCH code, performs the error correction, decodes data by deleting the parity bit from error corrected data, and outputs decoded data to the data inversion circuit 28. The bit error is error of difference between the read data and the decoded data. This operation accomplishes performing error correction for the data input from flash memory 12, decoding the corrected data, and outputting the decoded data. When the decoding and number of errors detecting unit 36 detects bit position where bit error occurs using generation polynomial of the BCH code for the read data having the code length for execution Scode, the decoding and number of errors detecting unit 36 detects number of bit of data occurred the bit error in of n (n is an integer greater than or equal to 1) pieces of data having the code length for execution Scode as number of errors data Nerror. The value of n that is number of the code length for execution Scode for detecting the number of errors data Nerror is set properly by experiment, analysis and so on. The arithmetic processing for the error correction by syndromes calculation using generation polynomial of the BCH code is widely known. A detailed explanation about the arithmetic processing for the error correction by syndromes calculation using generation polynomial of the BCH code is abbreviated.

Figure 5:
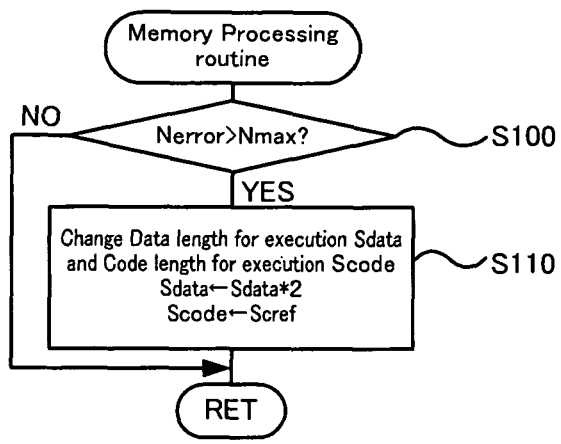
FIG. 5 schematically illustrates flow chart showing an operation of a memory processing unit 38.

FIG. 5 schematically illustrates flow chart showing an operation of the memory processing unit 38. The memory processing unit 38 compares the number of errors data Nerror detected by the encoding and number of errors detecting unit 36 with an upper limit number of errors Nmax that is an upper limit of number of errors in data detectable using n pieces of BCH code having the code length for execution Scode stored in the error correction information memory unit 32 (step S100). The upper limit number of errors Nmax is to be an upper limit of number of errors in data detectable using n pieces of BCH code having data length that is the data length for execution Sdata and code length that is the code length for execution Scode. For one example, in n pieces of BCH code having code length obtained by adding 104 bit parity bit to 512 byte data, that is, (512 byte+104 bit), an upper limit of errors that is detectable using one BCH code is 8 bit and an upper limit of errors that is detectable using n pieces of BCH code is n*8 bit. For another example, in n pieces of BCH code having code length obtained by adding 210 bit parity bit to 1K byte data, that is, (1K byte+210 bit), an upper limit of errors that is detectable using one BCH code is 15 bit and an upper limit of errors that is detectable using n pieces of BCH code is n*15 bit.

When the number of errors data Nerror exceeds the upper limit number of errors Nmax (step S100), twice as long data length as the stored data length for execution Sdata is stored as the data length for execution Sdata in the correction information memory unit 32, and code length Scref longer than the data length for execution Sdata and detectable more errors than the upper limit number of errors is stored as the code length for execution Scode in the correction information memory unit 32 (step S110). When the number of errors data Nerror lower than or equal to the upper limit number of errors Nmax (step S100), the process is ended without changing the code length for execution Scode and the data length for execution Sdata stored in the correction information memory unit 32. This arrangement stores longer data length for execution and longer code length for execution in the correction information memory unit 32 when the number of errors data Nerror exceeds the upper limit number of errors Nmax. For example, when the data length for execution of 512 byte and the code length for execution Scode of (512 byte+104 bit) is stored in the correction information memory unit 32 before step S110 is executed, the data length for execution of 1 Kbyte and the code length for execution Scode of (1 Kbyte+210 bit) is to be stored in the correction information memory unit 32 after the step S110 is executed.

The control circuit 40 is input control signals from the host device via the host interface circuit 22 and signals showing a state of the flash memory 12 from the flash memory 12 via the interface circuit 24, and outputs control signals to control the buffer circuit 26, the data inversion circuit 28, the error correction circuit 30 and the flash memory 12.

In the flash memory system 10 of this embodiment, when a write request signal requesting to write data to the flash memory 12 and an address signal showing address for writing data to the flash memory 12 are input in the control circuit 40 from the host device 60 via the host interface circuit 22, the control circuit 40 controls the host interface circuit 22, the buffer circuit 26, the data inversion circuit 28, the error correction circuit 30 and the memory interface circuit 24 such that data from the host device 60 is output from the memory interface circuit 24 to the flash memory 12 via the host interface circuit 22, the buffer circuit 26, the data inversion circuit 28 and the error correction circuit 30. The data inversion circuit 28 input data from the buffer circuit 26 reads data in 4 bit from the buffer circuit 26, adds inversion flag or not-inversion flag based on number of data of "1" or "0" included in the read 4 bit data, input the 5 bit data to the encoding unit 34 of the error correction circuit 30. The encoding unit 34 of the error correction circuit 30 input data reads the input data sequentially in the data length for execution Sdata, encodes the read data to BCH code having the code length for execution Scode, and outputs encoded data to the memory interface circuit 24. The control circuit 40 controls the flash memory 12 such that data encoded BCH code having the code length for execution Scode is stored in one page from the memory interface circuit 24 to the flash memory 12 via the error correction circuit 30. This arrangement accomplishes storing data encoded to BCH code having the code length for execution Scode to the flash memory 12 when the write request signal is input.

When a read request signal requesting to read data stored in the flash memory 12 and an address signal showing address for reading data from the flash memory 12 are input in the control circuit 40 from the host device 60 via the host interface circuit 22, the control circuit 40 controls the flash memory 12 such that data is read out in one page from the flash memory 12. The control circuit 40 controls the host interface circuit 22, the buffer circuit 26, the data inversion circuit 28, the error correction circuit 30 and the memory interface circuit 24 such that the read data from the flash memory 12 is output from the host interface circuit 22 to the host device 60 via the memory interface circuit 24, the error correction circuit 30, the data inversion circuit 28, and the buffer circuit 26. The decoding and number of errors detecting unit 36 of the error correction circuit 30 input data reads the input data in the code length for execution Scode. When bit error occurs in the read data, the decoding and number of errors detecting unit 36 performs error correction and inputs the decoded data having the data length for execution Sdata to the data inversion circuit 28. When bit error does not occur in the read data, the decoding and number of errors detecting unit 36 inputs data having the data length for execution Sdata obtained by decoding the read data to the data inversion circuit 28. The data inversion circuit 28 input data reads data in 5 bit. When the read data includes inversion bit, the data inversion circuit 28 performs the bit inversion and outputs 4 bit data obtained by deleting inversion bit from bit inverted data to the buffer circuit 26. When the read data includes not-inversion bit, the data inversion circuit 28 outputs 4 bit data obtained by deleting not-inversion bit from bit inverted data to the buffer circuit 26. The error corrected data is output to the host device when the read request signal is input and the bit error occurs in data stored in the flash memory 12. This arrangement accomplishes lowering the possibility of generation of bit error in the data read from the flash memory 12 and improvement of reliability of the flash memory system 10.

When a erase request signal requesting to erase data stored in the flash memory 12 and an block information signal showing an information of block to be erased are input in the control circuit 40 from the host device 60 via the host interface circuit 22, the control circuit 40 controls the flash memory 12 such that data is read out from an area of flash memory 12 corresponding to the block to be erase. The control circuit 40 controls the error correction circuit 30 and the memory interface circuit 24 such that data read from the flash memory 12 is input the decoding and number of errors detecting unit 36 of the error correcting circuit 30 via the memory interface circuit 24, and then controls flash memory 12 such that data stored in the block of the flash memory 12 to be erased is erased. The decoding and number of errors detecting unit 36 of the error correcting circuit 30 input data reads the input data in the code length for execution Scode, detects the number of errors data Nerror that is a number of bit of data where error is occurred of data having the code length for execution Scode using generation polynomial of the BCH code for n pieces of the read data having the code length for execution Scode, and outputs the detected number of errors data Nerror to the memory processing unit 38. The memory processing unit 38 compares the number of errors data Nerror with the upper limit number of errors Nmax. When the number of errors data Nerror exceeds the upper limit number of errors Nmax, twice as long data length as the stored data length for execution Sdata is stored as the data length for execution Sdata in the correction information memory unit 32 and code length that is detectable more number of errors than about upper limit value of number of errors detectable by the data length for execution Sdata is stored as the code length for execution Scode in the correction information memory unit 32. The reason for performing these process described above is explained below.

Figure 6:
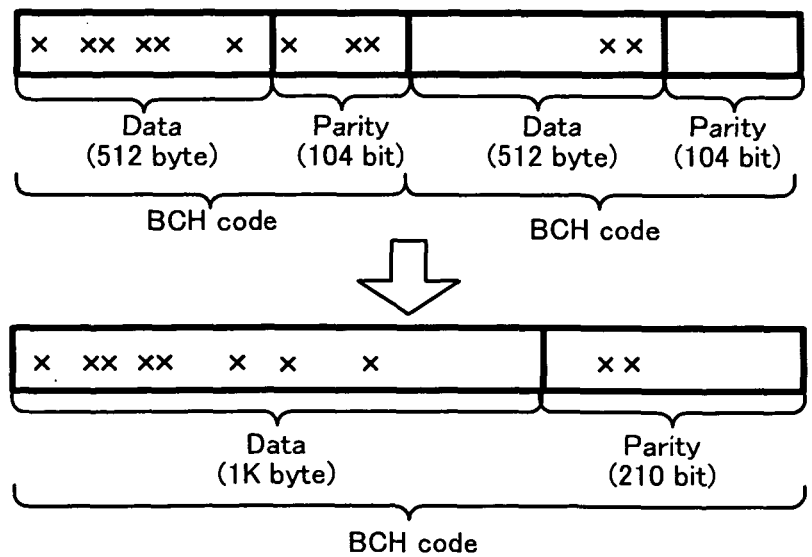
FIG. 6 schematically illustrates the configuration of generation of bit error in data stored in the flash memory 12.

FIG. 6 schematically illustrates the configuration of generation of bit error in data stored in the flash memory 12. In this embodiment, for illustrative purpose, the number of error data Nerror is to be detected in one data having the code length for execution Scode. In the figure, a symbol of "x" shows the position of data where error occurs. For illustrative purpose, at first, 512 byte as the data length for execution Sdata and (512 byte+104 bit) as the code length for execution Scode are stored in the error information memory unit 32 of error correcting circuit 30, bit error of 9 bit is to be occurs in data having the code length for execution Scode of (512 byte+104 bit) read out from the flash memory 12. Next, bit error of 2 bit is to be occurs in data having the code length for execution Scode of (512 byte+104 bit) read out from the flash memory 12. When the erase request signal is input, data having the code length for execution Scode of (512 byte+104 bit) is input to the decoding and number of errors detecting unit 36. BCH code corrects error up to 8 bit, that is, the upper limit number of errors Nmax equals to 8. The error correction circuit 30 does not correct error using BCH code having code length of (512 byte+104 bit) because bit error of 9 bit occurs in the data read out at first. When the detected number of error data Nerror exceeds the upper limit number of error Nmax, the error correction circuit 30 stores 1 Kbyte as the data length for execution Sdata and (1 Kbyte+210 bit) as the code length for execution Scode in the correction information memory unit 32. When the next write request signal is input, BCH code having code length that is (1 Kbyte+210 bit), that is, size of data is 1 Kbyte and size of parity bit is 210 bit is stored in the flash memory 12. Data is read out as BCH code having code length that is (1 Kbyte+210 bit) when data is read out from the flash memory 12. As shown in FIG. 6, the bit error of 11 bit occurs in the read data. BCH code having the code length of (1 Kbyte+210 bit) corrects error up to 15 bit, error correction is accomplished. Thus this arrangement makes the data length for execution Sdata and the code length for execution Scode stored in the correction information memory unit 32 longer when the detected number of errors Nerror exceeds the upper limit number of error Nmax. This arrangement accomplishes correcting more errors.

In the flash memory system 10 of the embodiment, when the erase request signal is input from the host device 60, the control circuit 40 controls the memory interface circuit 24, the error correction circuit 30 and the flash memory 12 such that data stored in the flash memory 12 is read out, the read data is input the decoding and number of errors detecting unit 36 of the error correcting circuit 30, and then data stored in the flash memory 12 is erased. The decoding and number of errors detecting unit 36 of the error correcting circuit 30 input data detects the number of error data Nerror. When the number of errors data Nerror exceeds the upper limit number of errors Nmax, the memory processing unit 38 of the error correction circuit 30 stores data length and code length of BCH code that detect more error than the upper limit number of error Nmax and data length is longer than the data length for execution Sdata stored in the correction information memory unit 32 as the data length for execution Sdata and the code length for execution Scode respectively. When the next write request signal is input, the encoding unit 34 of the error correction circuit 30 input data reads the input data sequentially in the data length for execution Sdata, encodes the read data to BCH code having the longer code length, and outputs encoded data. When the next read request signal is input, the decoding and number of errors detecting unit 36 of the error correction circuit 30 performs error correction for data using BCH code having longer code length for execution Scode. This arrangement accomplishes correcting more errors. The data inversion circuit 28 reads data sequentially in 4 bit from the buffer circuit 26. When number of data of "0" is more than number of data of "1" in 4 bit read data, the data inversion circuit 28 performs bit inversion that inverts data of "1" to data of "0" and inverts data of "0" to data of "1", adds inversion flag of "1", and outputs the added data to the error correction circuit 30. When the number of data of "0" is less than or equal to the number of data of "1" in 4 bit read data, the data inversion circuit 28 adds not-inversion flag of "0" to the read data without performing bit inversion, and outputs the added data to the error correction circuit 30. This arrangement accomplishes lowering the possibility of generation of error stored in the flash memory 12.

In the flash memory system 10 of the embodiment, the memory controller 20 is to control the NAND type flash memory having flash memory cell array that has a plurality of flash memory cells. Memory controlled by the memory controller 20 is not restricted to the NAND type flash memory. NOR type flash memory is allowed as the memory controlled by the memory controller 20. Memory controlled by the memory controller 20 is not restricted to the flash memory. Any one of nonvolatile memory is allowed. Nonvolatile memory that the possibility of generation of error in stored data tends to be higher by the write and erase times, for example, phase-change memory storing data by being changed the crystal structure of material, magnetoresistive memory storing data using spin of electron as memory element, ferroelectric memory storing data by relating positive and negative intrinsic polarization to 1 and 0 using hysteresis, or resistant change memory storing data using change of electrical resistance by applying voltage, is allowed.

Figure 7:
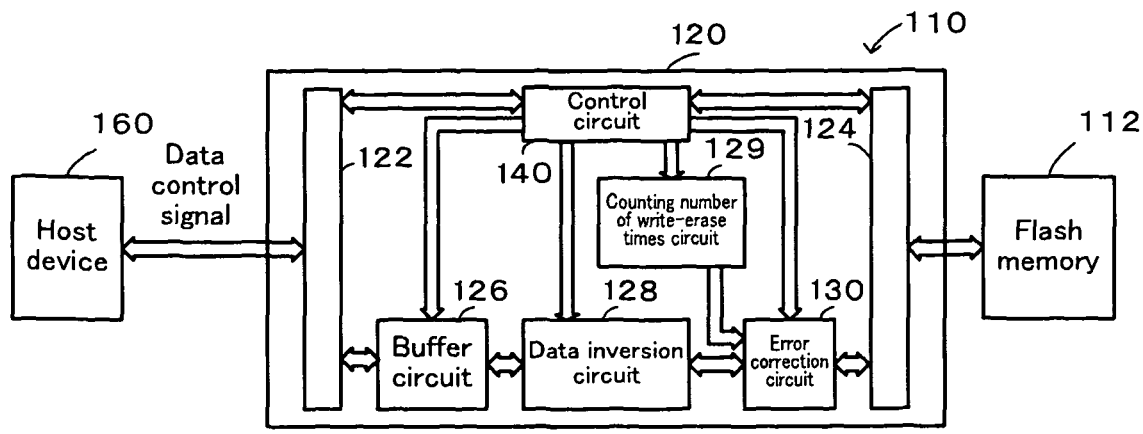
FIG. 7 schematically illustrates another configuration of a flash memory system 110 having a data input/output control device.

FIG. 7 schematically illustrates another configuration of a flash memory system 110 having a data input/output control device. The flash memory system 110 has a flash memory 112 structured by stacking a plurality of silicon chips formed NAND type flash memory, a memory controller 120 controlling the flash memory 112. The flash memory system 110 is connected to communicate with a host device 160 (for example, CPU (Central Processing Unit) and so on), stores data input from the host device 160 in the flash memory 112 or output the stored data to the host device 160. The flash memory 112 is to be formed on semiconductor chip that is different from semiconductor chip that the memory controller 120 is formed on.

The flash memory 112 is configured as NAND type flash memory having flash memory cell array (not illustrated) that has a plurality of flash memory cells that a threshold voltage varies by electrons injection into a floating gate or by drawing electrons away from the floating gate. In addition to the flash memory cell array, the flash memory 112 has Law decoder, column decoder, sense amplifier and so on (all not illustrated). In the flash memory 112, data is written or read out in a page (in this embodiment, one page corresponds to (512 byte+104 bit)), and the stored data is erased in a block (in this embodiment, one block corresponds to 64 page). In electrons injected into the floating gate, data stored in the flash memory cell is to be "0". In electrons drawn away from the floating gate and electrons in the floating gate less than when data stored in the flash memory cell is "0", data stored in the flash memory cell is to be "1".

The memory controller 120 is configured to be a logic circuit having a plurality of logic element, for example, transistor. The memory controller 120 have a host interface circuit 122 outputting control signals from the host 160, inputting data from the host device 160 and outputting data to the host device 160, a memory interface circuit 124 outputting control signals to flash memory 112, inputting data from the flash memory 112 and outputting data to the flash memory 112, a buffer circuit 126 temporally storing data input the host interface circuit 122, a data inversion circuit 128 reading out data from the buffer circuit 26, inversing or not inversing data based on number of "1" data included in the stored data, adding a not inversion flag or conversion flag and outputting the added data, a counting number of write-erase times circuit 129 counting write times to write data to the flash memory 122, an error correction circuit 130 encoding data from the data inversion circuit 128 using BCH (Bose-Chaudfuri-Hocquenghem) code, outputting encoded data to the memory interface circuit 124, decoding the data from the memory interface circuit 124 and outputting decoded data to the data inversion circuit, and a control circuit 140 controlling the operation of the entire memory controller 210.

Figure 8:
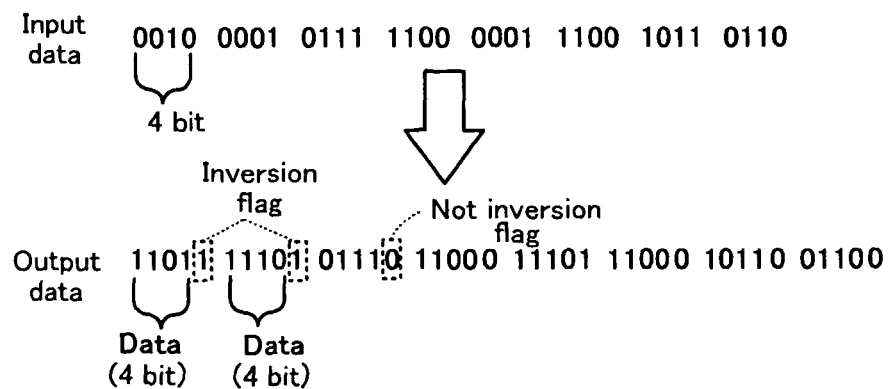
FIG. 8 schematically illustrates data output from a data inversion circuit 128 in response to data input in the data inversion circuit 128.

FIG. 8 schematically illustrates the data inversion circuit 128, which reads data sequentially in 4 bit from the buffer circuit 126. When number of data of "0" is more than number of data of "1" in 4 bit read data, the data inversion circuit 128 performs bit inversion that inverts data of "1" to data of "0" and inverts data of "0" to data of "1", adds inversion flag of "1" showing to perform bit inversion to the inverted data, and outputs the added data to the error correction circuit 130. When the number of data of "0" is less than or equal to the number of data of "1" in 4 bit read data, the data inversion circuit 128 adds not-inversion flag of "0" showing not to perform bit inversion to the read data without performing bit inversion, and outputs the added data to the error correction circuit 130. FIG. 2 schematically illustrates data output from a data inversion circuit 128 in response to data input in the data inversion circuit 128. The data inversion circuit 128 reads data sequentially in 5 bit from the error correction circuit 130. When the read data includes the inversion flag, the data inversion circuit 128 deletes the inversion flag from the read data, performs bit inversion to the deleted 4 bit data, and outputs the inverted data to the buffer circuit 126. When the read data includes the not-inversion flag, the data inversion circuit 128 deletes the not-inversion flag from the read data, and outputs the deleted data to the buffer circuit 126. These operations makes ratio of data of "1" in data output from the data inversion circuit 28 to the error correction circuit 130 increased. The reason for performing this operation is described below. In the flash memory cell, when the electrons are injected in the floating gate, gate insulator film deteriorates in stress given when the electrons pass through the gate insulator film. The more data of "0" is included, the higher possibility of generation of error in the data stored in the flash memory cell is seems to be. In data retention, error is occurred owing to leak of electron injected in the floating gate. The more data of "0" is included, the higher possibility of generation of error in the data stored in the flash memory cell is seems to be. The possibility of generation of error with data of "1" stored in the flash memory cell is less than that of error with data of "0" stored in the flash memory cell. The data inversion circuit 128 accomplishes lowering the possibility of generation of error stored in the flash memory 112.

The counting number of write-erase times circuit 129 counts number of write-erase times Nwr that is a sum of number of times writing data and number of times erasing data in the flash memory 112 with respect to each page. Information of page of the flash memory 12 written data and information of block erased data are input from the control circuit 40.

Figure 9:
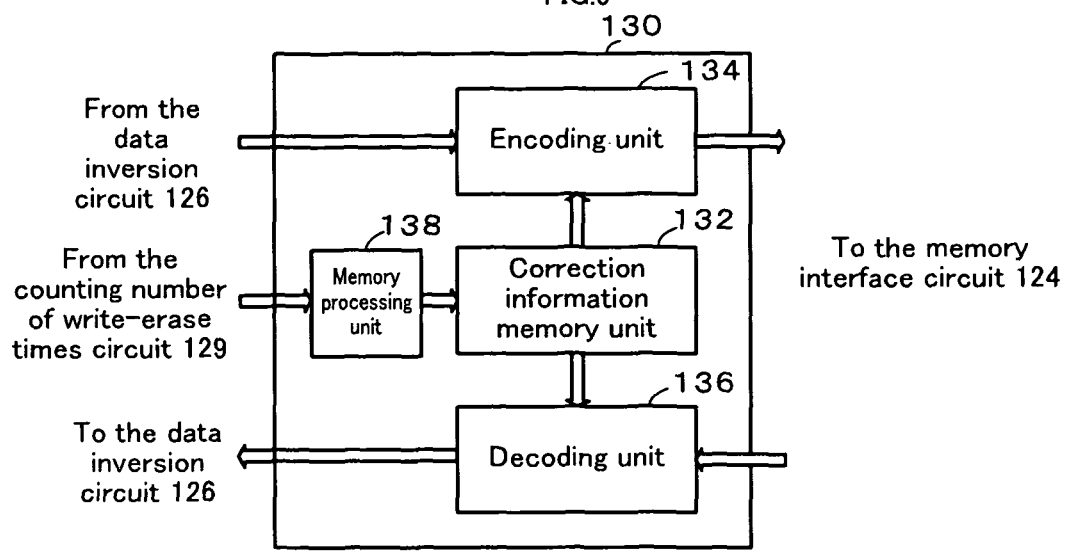
FIG. 9 schematically illustrates the configuration of an error correction circuit 130.

FIG. 9 schematically illustrates the configuration of an error correction circuit 130. The error correction circuit 130 is configured to be a logic circuit having a plurality of logic element, for example, transistor. The error correction circuit 130 has a correction information memory unit 132 storing code length for execution Scode that is size of BCH code using encoding and decoding data and data length for execution Sdata that is size of data encoded using BCH code of the code length for execution Scode, an encoding unit 134 encoding the data input from data inversion circuit 128 into BCH code having the code length for execution Scode stored in the correction information memory unit 132 and outputting the encoded data, a decoding unit 136 decoding data input from the flash memory 112 using BCH code and outputting the encoded data toe the data inversion circuit 128, a memory processing unit 138 changing the code length for execution Scode and the data length for execution stored in the correction information memory unit 132 based on a write times Nwr input from the error correction circuit 130.

Figure 10:
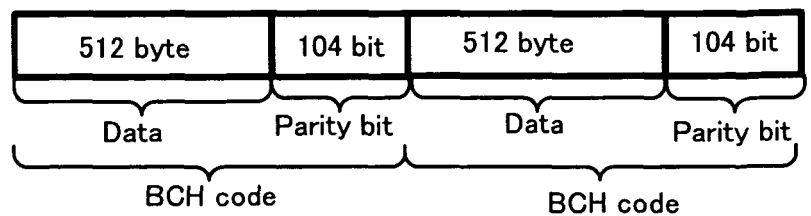
FIG. 10 schematically illustrates data structure output from an encoding unit 134 when data length for execution is 512 byte and code length for execution is (512K byte+104 bit).

The encoding unit 134 reads the input data from the data inversion circuit 128 in the data length for execution Sdata stored in the correction information memory unit 112, generates parity bit to be added for encoding the read data having the data length for execution Sdata to the BCH code having the code length for execution Scode by arithmetic processing using generation polynomial of the BCH code, and outputs data obtained by adding the generated parity bit to the read data having the data length for execution Sdata to the memory interface circuit 124. FIG. 10 schematically illustrates data structure output from an encoding unit 134 when data length for execution is 512 byte and code length for execution is (512K byte+104 bit). The arithmetic processing using generation polynomial of the BCH code is widely known. A detailed explanation about processing using generation polynomial of the BCH code is abbreviated.

The decoding unit 136 reads the input data from the flash memory 112 via the memory interface circuit 124 in the code length for execution Sdata stored in the correction information memory unit 132, detects bit position where bit error occurs by syndromes calculation for the read data having the code length for execution Scode using generation polynomial of the BCH code, performs the error correction, decodes data by deleting the parity bit from error corrected data, and outputs decoded data to the data inversion circuit 128. The bit error is error of difference between the read data and the decoded data. This operation accomplishes performing error correction for the data input from flash memory 112, decoding the corrected data, and outputting the decoded data. The arithmetic processing for the error correction by syndromes calculation using generation polynomial of the BCH code is widely known. A detailed explanation about the arithmetic processing for the error correction by syndromes calculation using generation polynomial of the BCH code is abbreviated.

Figure 11:
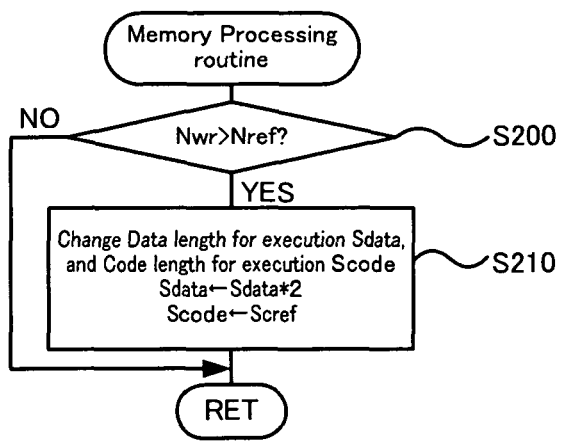
FIG. 11 schematically illustrates flow chart showing an operation of a memory processing unit 38.
Figure 12:
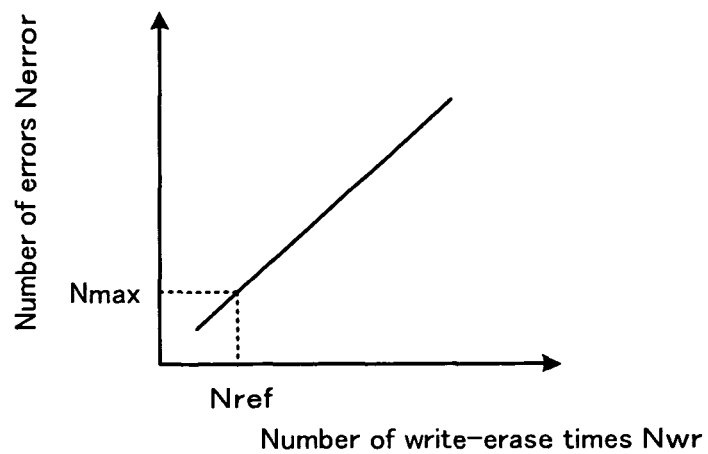
FIG. 12 schematically illustrates relation between number of errors Nerror and number of write-erase times Nwr.

FIG. 11 schematically illustrates flow chart showing an operation of the memory processing unit 138. The memory processing unit 138 compares the number of write-erase times Nwr input from the counting number of write-erase times circuit 129 with threshold for judgment Nref (step S200). Relation between number of errors Nerror that is number of bit error occurred in n (n is an integer greater than or equal to 1) pieces of data of BCH code having the code length for execution Scode stored in the flash memory and the number of write-erase times Nwr is obtained as map by experiment or analysis and so on preliminary, the number of errors Nerror is to be upper limit number of errors Nmax that is upper limit of number of errors in data detectable using n pieces of BCH code having the code length for execution Scode. The threshold for judgment Nref is to be set as the number of write-erase times Nwr corresponding the number of errors Nerror. FIG. 12 schematically illustrates relation between the number of errors Nerror and the number of write-erase times Nwr. The reason why the relation between the number of errors Nerror and the number of write-erase times Nwr is shown in FIG. 12 is described below. In the flash memory 12, the more the number of write-erase times Nwr for the flash memory cell is, the more gate insulator film of the flash memory cell generally deteriorates, that is, the more the number of errors Nerror is. The upper limit number of errors Nmax is to be set based on the code length for execution Scode. For one example, in n pieces of BCH code having code length that is (512 byte+104 bit), an upper limit of errors that is detectable using one BCH code is 8 bit and an upper limit of errors that is detectable using n pieces of BCH code is n*8 bit. For another example, in n pieces of BCH code having code length that is (1K byte+210 bit), an upper limit of errors that is detectable using one BCH code is 15 bit and an upper limit of errors that is detectable using n pieces of BCH code is n*15 bit.

When the number of write-erase times Nwr exceeds the threshold for judgment Nref (step S200), twice as long data length as the stored data length for execution Sdata is stored as the data length for execution Sdata in the correction information memory unit 132, and code length Scref longer than the data length for execution Sdata and detectable more errors than the upper limit number of errors is stored as the code length for execution Scode in the correction information memory unit 132 (step S210). When the number of write-erase times Nwr lower than or equal to the threshold for judgment Nref (step S200), the process is ended without changing the code length for execution Scode and the data length for execution Sdata stored in the correction information memory unit 32. This arrangement stores longer data length for execution and longer code length for execution in the correction information memory unit 132 when the number of errors data Nerror exceeds the upper limit number of errors Nmax. For example, when the data length for execution of 512 byte and the code length for execution Scode of (512 byte+104 bit) is stored in the correction information memory unit 132 before step S210 is executed, the data length for execution of 1 Kbyte and the code length for execution Scode of (1 Kbyte+210 bit) is to be stored in the correction information memory unit 132 after the step S210 is executed.

The control circuit 140 is input control signals from the host device via the host interface circuit 122 and signals showing a state of the flash memory 112 from the flash memory 112 via the interface circuit 124, and outputs control signals to control the buffer circuit 126, the data inversion circuit 128, the error correction circuit 130 and the flash memory 112.

In the flash memory system 110 of this embodiment, when a write request signal requesting to write data to the flash memory 112 and an address signal showing address for writing data to the flash memory 112 are input in the control circuit 140 from the host device 160 via the host interface circuit 122, the control circuit 140 controls the host interface circuit 122, the buffer circuit 26, the data inversion circuit 128, the error correction circuit 130 and the memory interface circuit 124 such that data from the host device 160 is output from the memory interface circuit 124 to the flash memory 112 via the host interface circuit 122, the buffer circuit 126, the data inversion circuit 128 and the error correction circuit 130. The data inversion circuit 128 input data from the buffer circuit 126 reads data in 4 bit from the buffer circuit 126, adds inversion flag or not-inversion flag based on number of data of "1" or "0" included in the read 4 bit data, input the 5 bit data to the encoding unit 134 of the error correction circuit 130. The encoding unit 134 of the error correction circuit 130 input data reads the input data sequentially in the data length for execution Sdata, encodes the read data to BCH code having the code length for execution Scode, and outputs encoded data to the memory interface circuit 124. The control circuit 140 controls the flash memory 112 such that data encoded BCH code having the code length for execution Scode is stored in one page from the memory interface circuit 124 to the flash memory 112 via the error correction circuit 130. This arrangement accomplishes storing data encoded to BCH code having the code length for execution Scode to the flash memory 112 when the write request signal is input.

When a read request signal requesting to read data stored in the flash memory 112 and an address signal showing address for reading data from the flash memory 112 are input in the control circuit 140 from the host device 160 via the host interface circuit 122, the control circuit 140 controls the flash memory 112 such that data is read out in one page from the flash memory 112. The control circuit 410 controls the host interface circuit 122, the buffer circuit 126, the data inversion circuit 128, the error correction circuit 310 and the memory interface circuit 124 such that the read data from the flash memory 112 is output from the host interface circuit 122 to the host device 160 via the memory interface circuit 124, the error correction circuit 130, the data inversion circuit 128, and the buffer circuit 126. The decoding unit 136 of the error correction circuit 130 input data reads the input data in the code length for execution Scode. When bit error occurs in the read data, the decoding unit 36 performs error correction and inputs the decoded data having the data length for execution Sdata to the data inversion circuit 128. When bit error does not occur in the read data, the decoding and number of errors detecting unit 136 inputs data having the data length for execution Sdata obtained by decoding the read data to the data inversion circuit 128. The data inversion circuit 128 input data reads data in 5 bit. When the read data includes inversion bit, the data inversion circuit 28 performs the bit inversion and outputs 4 bit data obtained by deleting inversion bit from bit inverted data to the buffer circuit 26. When the read data includes not-inversion bit, the data inversion circuit 128 outputs 4 bit data obtained by deleting not-inversion bit from bit inverted data to the buffer circuit 126. The error corrected data is output to the host device when the read request signal is input and the bit error occurs in data stored in the flash memory 112. This arrangement accomplishes lowering the possibility of generation of bit error in the data read from the flash memory 112 and improvement of reliability of the flash memory system 110.

When a erase request signal requesting to erase data stored in the flash memory 112 and an block information signal showing an information of block to be erased are input in the control circuit 140 from the host device 160 via the host interface circuit 122, the control circuit 140 controls the flash memory 112 such that data is read out from an area of flash memory 112 corresponding to the block to be erase.

Figure 13:
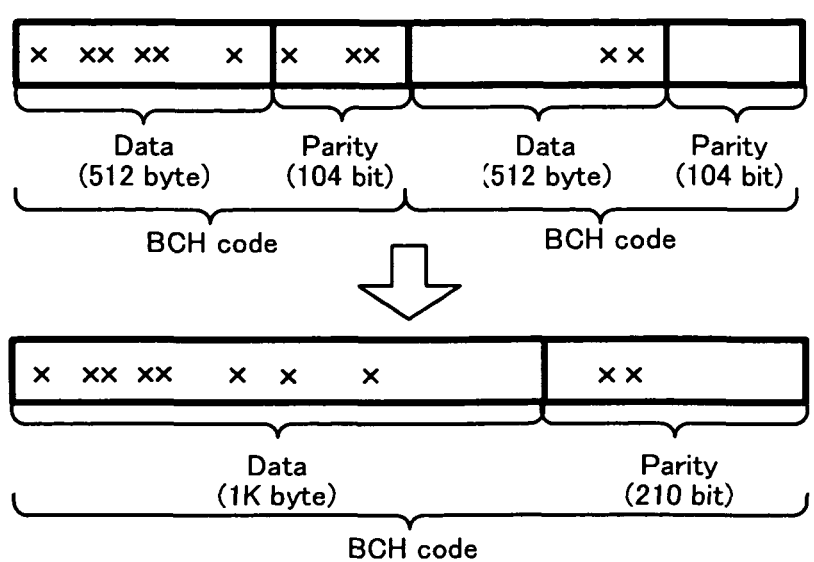
FIG. 13 schematically illustrates the configuration of generation of bit error in data stored in the flash memory 112.

In the flash memory system 110 of the embodiment, when the counting number of write-erase times Nwr counted by the counting number of write-erase times circuit 129 exceeds the threshold for judgment Nref, the memory processing unit 138 of the error correction circuit 130 makes twice as long data length as the stored data length for execution Sdata stored as the data length for execution Sdata in the correction information memory unit 132, and makes code length longer than the data length for execution Sdata and detectable more errors than the upper limit number of errors stored as the code length for execution Scode in the correction information memory unit 132. FIG. 13 schematically illustrates the configuration of generation of bit error in data stored in the flash memory 112. In this embodiment, for illustrative purpose, the number of error data Nerror is to be detected in one data having the code length for execution Scode. In the figure, a symbol of "x" shows the position of data where error occurs. For illustrative purpose, at first, 512 byte as the data length for execution Sdata and (512 byte+104 bit) as the code length for execution Scode are stored in the error information memory unit 132 of error correcting circuit 130, bit error of 9 bit is to be occurs in data having the code length for execution Scode of (512 byte+104 bit) read out from the flash memory 112. Next, bit error of 2 bit is to be occurs in data having the code length for execution Scode of (512 byte+104 bit) read out from the flash memory 112. When the read request signal is input, data having the code length for execution Scode of (512 byte+104 bit) is input to the decoding unit 136. BCH code corrects error up to 8 bit, that is, the upper limit number of errors Nmax equals to 8. The error correction circuit 130 does not correct error using BCH code having code length of (512 byte+104 bit) because bit error of 9 bit occurs in the data read out at first. When the counting number of write-erase times Nwr counted by the counting number of write-erase times circuit 129 exceeds the threshold for judgment Nref, the error correction circuit 130 stores 1 Kbyte as the data length for execution Sdata and (1 Kbyte+210 bit) as the code length for execution Scode in the correction information memory unit 132. When the next write request signal is input, BCH code having code length that is (1 Kbyte+210 bit), that is, size of data is 1 Kbyte and size of parity bit is 210 bit is stored in the flash memory 12. Data is read out as BCH code having code length that is (1 Kbyte+210 bit) when data is read out from the flash memory 112. As shown in FIG. 13, the bit error of 11 bit occurs in the read data. BCH code having the code length of (1 Kbyte+210 bit) corrects error up to 15 bit, error correction is accomplished. Thus this arrangement makes the data length for execution Sdata and the code length for execution Scode stored in the correction information memory unit 132 longer when the counting number of write-erase times Nwr exceeds the threshold for judgment Nref. This arrangement accomplishes correcting more errors.

In the flash memory system 10 of the embodiment, when the counting number of write-erase times Nwr exceeds the threshold for judgment Nref, the memory processing unit 138 of the error correction circuit 130 stores data length and code length of BCH code that detect more error than the upper limit number of error Nmax and data length is longer than the data length for execution Sdata stored in the correction information memory unit 312 as the data length for execution Sdata and the code length for execution Scode respectively. When the next write request signal is input, the encoding unit 134 of the error correction circuit 130 input data reads the input data sequentially in the data length for execution Sdata, encodes the read data to BCH code having the longer code length, and outputs encoded data. When the next read request signal is input, the decoding and number of errors detecting unit 136 of the error correction circuit 130 performs error correction for data using BCH code having longer code length for execution Scode. This arrangement accomplishes correcting more errors. The data inversion circuit 128 reads data sequentially in 4 bit from the buffer circuit 126. When number of data of "0" is more than number of data of "1" in 4 bit read data, the data inversion circuit 128 performs bit inversion that inverts data of "1" to data of "0" and inverts data of "0" to data of "1", adds inversion flag of "1", and outputs the added data to the error correction circuit 130. When the number of data of "0" is less than or equal to the number of data of "1" in 4 bit read data, the data inversion circuit 128 adds not-inversion flag of "0" to the read data without performing bit inversion, and outputs the added data to the error correction circuit 130. This arrangement accomplishes lowering the possibility of generation of error stored in the flash memory 112.

In the flash memory system 110 of the embodiment, the memory controller 120 is to control the NAND type flash memory having flash memory cell array that has a plurality of flash memory cells. Memory controlled by the memory controller 120 is not restricted to the NAND type flash memory. NOR type flash memory is allowed as the memory controlled by the memory controller 120. Memory controlled by the memory controller 20 is not restricted to the flash memory. Any one of nonvolatile memory is allowed. Nonvolatile memory that the possibility of generation of error in stored data tends to be higher by the write and erase times, for example, phase-change memory storing data by being changed the crystal structure of material, magnetoresistive memory storing data using spin of electron as memory element, ferroelectric memory storing data by relating positive and negative intrinsic polarization to 1 and 0 using hysteresis, or resistant change memory storing data using change of electrical resistance by applying voltage, is allowed.

In the flash memory system 10 or 110 of the embodiment, the upper limit number of errors Nmax is to be the upper limit of number of errors in data detectable using n pieces of BCH code having data length that is the data length for execution Sdata and code length that is the code length for execution Scode. The upper limit number of errors Nmax is allowed to be a value slight smaller than this upper limit of number of errors. For example, in n pieces of BCH code having code length of (512 byte+104 bit) obtained by adding 512 byte data to 104 bit parity bit, upper limit of number of errors that is detectable using one BCH code is 8 bit. The upper limit number of errors Nmax is preferable to be a few bit or a little more than 10 bit shorter than n*8 bit. In n pieces of BCH code having code length of (1 Kbyte+210 bit) obtained by adding 1 Kbyte data to 210 bit parity bit, upper limit of number of errors that is detectable using one BCH code is 15 bit. The upper limit number of errors Nmax is preferable to be a few bit or a little more than 10 bit shorter than n*15 bit.

In the flash memory system 10 or 110 of the embodiment, when the memory processing unit 38 or 138 stores the data length longer than the data length for execution Sdata and the code length of BCH code stored in the correction information memory unit 32 or 132 as the data length for execution Sdata and the code length for execution Scode respectively, the memory processing unit 38 or 138 sets the data length for execution Sdata and the code length for execution Scode such that the data length for execution Sdata and the code length for execution Scode are lower than an upper limit code length for execution Scmax that is an upper limit of the code length for execution Scode, and stores the data length for execution Sdata and the code length for execution Scode in the correction information memory unit 32 or 132. In this case, the upper limit code length for execution Scmax is allowed to be set such the code length for execution Scode that consumption power of the error correction circuit 30 is lower than or equal to an allowed power allowed to the error correction circuit 30, the code length for execution Scode that consumption power of circuit combined with the host interface circuit 22, the buffer circuit 26, the data inversion circuit 28, the error correction circuit 30 and the memory interface circuit 24 is lower than or equal to an allowed power allowed to the combined circuit, or the code length for execution Scode that consumption power of the memory controller 20 is lower than or equal to an allowed power allowed to the memory controller 20. The reason of setting above is described below. The longer the code length for execution Scode is, the more the consumption power of the error correction circuit 30 is, that is, the more the consumption power of the error correction circuit 30, the consumption power of the circuit combined with the host interface circuit 22, the buffer circuit 26, the data inversion circuit 28, the error correction circuit 30 and the memory interface circuit 24, or the consumption power of the memory controller 20 is. This arrangement accomplishes suppressing the consumption power of the error correction circuit 30, the consumption power of the circuit combined with the host interface circuit 22, the buffer circuit 26, the data inversion circuit 28, the error correction circuit 30 and the memory interface circuit 24, or the consumption power of the memory controller 20 exceeds the allowed power respectively. The upper limit code length for execution Scmax is allowed to be set such the code length for execution Scode that read out speed being amount of data that the memory interface circuit 24 reads out from the flash memory 12 per unit time is lower than or equal to an allowed speed allowed to the interface circuit 24. The longer the code length for execution Scode is, the later the read out speed of memory interface circuit 24. This is the reason why the upper limit code length for execution Scmax is set above. This arrangement accomplishes suppressing the read out speed reading out data from the flash memory 12 being lower than or equal to the allowed speed. The upper limit code length for execution Scmax is allowed to be set such the code length for execution Scode that area of the error correction circuit 30 is lower than or equal to an allowed area allowed to the error correction circuit 30, the code length for execution Scode that are of circuit combined with the host interface circuit 22, the buffer circuit 26, the data inversion circuit 28, the error correction circuit 30 and the memory interface circuit 24 is lower than or equal to an allowed are allowed to the combined circuit, or the code length for execution Scode that area of the memory controller 20 is lower than or equal to an allowed area allowed to the memory controller 20. The longer the code length for execution Scode is, the larger area of the error correction circuit 30 is, that is, the larger area of the error correction circuit 30, the area of the circuit combined with the host interface circuit 22, the buffer circuit 26, the data inversion circuit 28, the error correction circuit 30 and the more area the memory interface circuit 24, or the area of the memory controller 20 is. This is the reason why the upper limit code length for execution Scmax is set above. This arrangement accomplishes suppressing the area of the error correction circuit 30, the area of the circuit combined with the host interface circuit 22, the buffer circuit 26, the data inversion circuit 28, the error correction circuit 30 and the memory interface circuit 24, or the area of the memory controller 20 exceeds the allowed area respectively. The upper limit code length for execution Scmax is allowed to be set considering a plurality of the consumption power of above circuit, the read out speed, and the area of above circuit.

In the flash memory system 10 or 110 of the embodiment, the memory processing unit 38 or 138 is to store twice as long data length as the stored data length for execution Sdata as the data length for execution Sdata in the correction information memory unit 132 when the number of write-erase times Nwr exceeds the threshold for judgment Nref. The memory processing unit 38 or 138 is allowed to store data length longer than the stored data length for execution Sdata as the data length for execution Sdata in the correction information memory unit 132. For example, the memory processing unit 38 or 138 is allowed to store m (m is an integer greater than or equal to 3) times as long data length as the stored data length for execution Sdata as the data length for execution Sdata in the correction information memory unit 132.

In the flash memory system 10 or 110 of the embodiment, the data inversion circuit 28 or 128 is to read data sequentially in 4 bit from the buffer circuit 26 or 126, and add the 1 bit inversion flag or the 1 bit not inversion flag to data based on number of data of "1" of data of "0" included in the 4 bit data. Any size, that is, number of bit, is allowed for data read out from the buffer circuit 26 or 126, the inversion flag or the not inversion flag. For data from the error correction circuit 130, the data that the inversion flag or the not inversion flag is deleted from, considering size of the added inversion flag or the added not inversion flag is output to the buffer circuit 26 or 126.

In the flash memory system 10 or 110 of the embodiment, BCH code is to be used for encoding data. Code used for error correction is not restricted to BCH code. The block code such as Reed-Solomon code or the convolutional code such as LDPC code is allowed to be used as Code for error correction.

In the flash memory system 10 or 110 of the embodiment, the memory controller 20 is to have the data conversion circuit 28 or 128. The memory controller 20 is allowed not to have the data conversion circuit 28. In this case, data is input or output between the buffer circuit 26 or 126 and the error correction circuit 30 or 130.

In the flash memory system 10 or 110 of the embodiment, the flash memory cell is to be two-valued storage element that stores data being to be "0" in electrons injected into the floating gate and data being to be "1" in electrons drawn away from the floating gate and electrons in the floating gate less than when data stored in the flash memory cell is "0". The flash memory cell is allowed to be multi-valued storage element. For example, the flash memory cell is allowed to be four-valued storage element that is controlled such that amount of electron injection to the floating gate has four steps and stores four-value such as "00", "01", "10" and "11".

In the flash memory system 10 or 110 of the embodiment, the flash memory 12 of 112 is to be formed on semiconductor chip that is different from semiconductor chip that the memory controller 20 or 120 is formed on. The flash memory 12 of 112 is allowed to be formed on semiconductor chip that is the same chip as the semiconductor chip the memory controller 20 or 120 is formed on.

The embodiment discussed above is to be considered in all aspects as illustrative and no restrictive. There may be many modifications, changes, and alternative without departing from the scope or spirit of the main characteristics of the present invention. The scope and spirit of the present invention are indicated by the appended claims, rather than by the foregoing description.

The invention is an accomplishment of project of Strategic creative research promotion business of incorporated administrative agency Japan Science and Technology Agency in the 21 year of the Heisei era, "Dependable wireless solid-state-drive".

The disclosure of Japanese Patent Application No. 2010-104007 filed on Apr. 28, 2010 including specification, drawings and claims is incorporated herein by reference in its entirety.

What is claimed is:

1. A data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device, the data input/output control device comprising:

a data correction input/output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; an error detecting unit configured to read input data sequentially in the stored code length for execution and detect number of erroneous data in the read n (n is an integer greater than or equal to 1) pieces of data using the predetermined error correcting code; and a memory processing unit configured to store length of data that is longer than the data length for execution as the data length for execution in the error correction information memory unit and code length of the predetermined error correcting code as the code length for execution in the error correction information memory unit when the detected number of erroneous data exceeds a predefined upper limit number of errors, the length of data and the code length of the predetermined error correcting code are set to correct and detect more errors than the upper limit number of errors that is correctable and detectable using one predetermined error correcting code with the code length for execution; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit, and the data output from the decoding unit of the data correction input/output circuit is output to the host device when a read out request signal requesting to read out data stored in the semiconductor memory device is input from the host device, and control the data correction input/output circuit and the semiconductor memory device such that the data stored in the semiconductor memory device is read out to be erased after the data read out is input into the error detection unit of the data correction input/output circuit when an erase request signal requesting to erase data stored in the semiconductor memory device is input from the host device.

2. The data input/output control device according to claim 1, wherein the memory processing unit of the data correction input/output circuit is configured to store length of data that is m (m is an integer greater than or equal to 2) times the stored data length for execution in the error correction information memory unit as the data length for execution when number of the detected errors exceeds the upper limit number of errors.

3. The data input/output control device according to claim 1, wherein the memory processing unit of the data correction input/output circuit is configured to store the data length for execution and the code length for execution set such that the code length for execution stored in the error correction information memory unit is shorter than a predefined upper limit power allowable code length, the predefined upper limit power allowable code length being an upper limit of the code length for execution that makes power consumed by the data correction input/output circuit lower than or equal to allowable power allowed in the data correction input/output circuit.

4. The data input/output control device according to claim 1, wherein the memory processing unit of the data correction input/output circuit is configured to store the data length for execution and the code length for execution set such that the code length for execution stored in the error correction information memory unit is shorter than a predefined upper limit speed allowable code length, the predefined upper limit speed allowable code length being an upper limit of the code length for execution that makes read out speed lower than or equal to allowable read out speed allowed in the data correction input/output circuit, the read out speed being amount of data that the data correction input/output circuit reads out from the semiconductor memory device per unit time.

5. The data input/output control device according to claim 1, wherein the memory processing unit of the data correction input/output circuit is configured to store the data length for execution and the code length for execution set such that the code length for execution stored in the error correction information memory unit is shorter than a predefined upper limit area allowable code length, the predefined upper limit area allowable being an upper limit of the code length for execution that makes area of the data correction input/output circuit smaller than or equal to allowable area allowed in the data correction input/output circuit.

6. The data input/output control device according to claim 1, wherein the semiconductor memory device comprises a plurality of semiconductor memory elements that store a plurality of electron injection states as multilevel storage based on amount of electrons injected to floating gates and have disposition of facilitating degradation with growth of amount of electrons injected to the floating gates, the data correction input/output circuit comprises a data conversion unit configured to read the input data sequentially in a first length, append a first flag having second length to the input data and output the appended data to the encoding unit when number of high electron injection data of the read data having the first length is less than or equal to number of low electron injection data, perform data conversion that converts the high electron injection data into the low electron injection data and the low electron injection data into the high electron injection data and append the converted data to a second flag having the second length to output the appended data to the encoding unit when the number of high electron injection data of the read data having the first length is more than number of low electron injection data, read the output data from the decoded unit sequentially in a third length that is a sum of the first length and the second length, output data that is obtained by deleting the first flag from the read data having the third length when the read data having the third length includes the first flag, and perform the data conversion to data that is obtained by deleting the second flag from the read data having the third length and output the converted data when the read data having the third length includes the second flag, the high electron injection data sets the semiconductor memory elements in a state that amount of electrons injected to the floating gates is more than the amount of electrons injected to the floating gates in predetermined electron injection state, and the low electron injection data sets the semiconductor memory elements in a state that the amount of electrons injected to the floating gates is less than the amount of electrons injected to the floating gates in the predetermined high electron injection state, and the control circuit is configured to control the data correction input/output circuit and the semiconductor memory device such that data input from the host device is input into the encoding unit of the data correction input/output circuit via the data conversion unit of the data correction input/output circuit when the write request signal is input from the host device, and control the data correction input/output circuit and the semiconductor memory device such that the data output from the decoding unit of the data correction input/output circuit is output to the host device via the data conversion unit of the data correction input/output circuit when the read out request signal is input from the host device.

7. The data input/output control device according to claim 6, wherein the semiconductor memory element stores the high electron injection state that is a state with electron injected to the floating gate and the low electron injection state that is a state with less electron than that of high electron injection state injected to the floating gate as two-valued storage, the high electron injection data makes the semiconductor elements as the high electron injection state, and the low electron injection data makes the semiconductor elements as the low electron injection state.

8. The data input/output control device according to claim 1, wherein specified error correcting code is block code or convolutional code.

9. The data input/output control device according to claim 1, wherein the semiconductor memory device has such a deposition that probability that error occurs in the stored data increase with number of read-erase times, the read-erase times is a sum of number of times of writing data to the semiconductor memory device and number of times of erasing data stored in the semiconductor device.

10. The data input/output control device according to claim 1, wherein the semiconductor memory device is any one of NAND type flash memory, NOR type flash memory, phase change memory, magnetic memory, ferroelectric memory and resistive memory, or combination thereof.

11. The data input/output control device according to claim 1, wherein the semiconductor memory device is formed on a semiconductor chip different from a semiconductor chip that the data input/output control device is formed.

12. A data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device, the data input/output control device comprising:

a counting number of write times circuit configured to count number of write-erase times that is a sum of number of times writing data to the semiconductor memory device and number of times erasing data stored in the semiconductor memory device;

a data correction input and output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; and a memory processing unit configured to store length of data as the data length for execution in the error correction information memory unit and code length of the predetermined error correcting code as the code length for execution in the error correction information when the counted number of write and erase times exceeds a threshold for judgment assumed that more error than the predefined upper limit number of errors are generated in n (n is an integer greater than or equal to 1) pieces of data having the code length for execution, the length of data and the code length of the predetermined error correcting code are set to correct and detect more errors than an upper limit number of errors that is corrected detected using one predetermined error correcting code having the code length for execution; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit, and the data output from the decoding unit of the data correction input/output circuit is output to the host device when a read out request signal requesting to read out data stored in the semiconductor memory device is input from the host device, and control the semiconductor memory device such that the data stored in the semiconductor memory device is erased when an erase request signal requesting to erase data stored in the semiconductor memory device is input from the host device.

13. The data input/output control device according to claim 12, wherein the memory processing unit of the data correction input/output circuit is configured to store length of data that is m (m is an integer greater than or equal to 2) times the stored data length for execution in the error correction information memory unit as the data length for execution when number of the counted number of write-erase times exceeds the threshold.

14. The data input/output control device according to claim 12, wherein the memory processing unit of the data correction input/output circuit is configured to store the data length for execution and the code length for execution set such that the code length for execution stored in the error correction information memory unit is shorter than a predefined upper limit power allowable code length, the predefined upper limit power allowable code length being an upper limit of the code length for execution that makes power consumed by the data correction input/output circuit lower than or equal to allowable power allowed in the data correction input/output circuit.

15. The data input/output control device according to claim 12, wherein the memory processing unit of the data correction input/output circuit is configured to store the data length for execution and the code length for execution set such that the code length for execution stored in the error correction information memory unit is shorter than a predefined upper limit speed allowable code length, the predefined upper limit speed allowable code length being an upper limit of the code length for execution that makes read out speed lower than or equal to allowable read out speed allowed in the data correction input/output circuit, the read out speed being amount of data that the data correction input/output circuit reads out from the semiconductor memory device per unit time.

16. The data input/output control device according to claim 12, wherein the memory processing unit of the data correction input/output circuit is configured to store the data length for execution and the code length for execution set such that the code length for execution stored in the error correction information memory unit is shorter than a predefined upper limit area allowable code length, the predefined upper limit area allowable being an upper limit of the code length for execution that makes area of the data correction input/output circuit smaller than or equal to allowable area allowed in the data correction input/output circuit.

17. The data input/output control device according to claim 12, wherein the semiconductor memory device comprises a plurality of semiconductor memory elements that store a plurality of electron injection states as multilevel storage based on amount of electrons injected to floating gates and have disposition of facilitating degradation with growth of amount of electrons injected to the floating gates, the data correction input/output circuit comprises a data conversion unit configured to read the input data sequentially in a first length, append a first flag having second length to the input data and output the appended data to the encoding unit when number of high electron injection data of the read data having the first length is less than or equal to number of low electron injection data, perform data conversion that converts the high electron injection data into the low electron injection data and the low electron injection data into the high electron injection data and append the converted data to a second flag having the second length to output the appended data to the encoding unit when the number of high electron injection data of the read data having the first length is more than number of low electron injection data, read the output data from the decoded unit sequentially in a third length that is a sum of the first length and the second length, output data that is obtained by deleting the first flag from the read data having the third length when the read data having the third length includes the first flag, and perform the data conversion to data that is obtained by deleting the second flag from the read data having the third length and output the converted data when the read data having the third length includes the second flag, the high electron injection data sets the semiconductor memory elements in a state that amount of electrons injected to the floating gates is more than the amount of electrons injected to the floating gates in predetermined electron injection state, and the low electron injection data sets the semiconductor memory elements in a state that the amount of electrons injected to the floating gates is less than the amount of electrons injected to the floating gates in the predetermined high electron injection state, and the control circuit is configured to control the data correction input/output circuit and the semiconductor memory device such that data input from the host device is input into the encoding unit of the data correction input/output circuit via the data conversion unit of the data correction input/output circuit when the write request signal is input from the host device, and control the data correction input/output circuit and the semiconductor memory device such that the data output from the decoding unit of the data correction input/output circuit is output to the host device via the data conversion unit of the data correction input/output circuit when the read out request signal is input from the host device.

18. The data input/output control device according to claim 17, wherein the semiconductor memory element stores the high electron injection state that is a state with electron injected to the floating gate and the low electron injection state that is a state with less electron than that of high electron injection state injected to the floating gate as two-valued storage,
the high electron injection data makes the semiconductor elements as the high electron injection state, and
the low electron injection data makes the semiconductor elements as the low electron injection state.

19. The data input/output control device according to claim 12, wherein specified error correcting code is block code or convolutional code.

20. The data input/output control device according to claim 12, wherein the semiconductor memory device has such a deposition that probability that error occurs in the stored data increases with number of read-erase times, the read-erase times is a sum of number of times of writing data to the semiconductor memory device and number of times of erasing data stored in the semiconductor device.

21. The data input/output control device according to claim 12, wherein the semiconductor memory device is any one of NAND type flash memory, NOR type flash memory, phase change memory, magnetic memory, ferroelectric memory and resistive memory, or combination thereof.

22. The data input/output control device according to claim 12, wherein the semiconductor memory device is formed on a semiconductor chip different from a semiconductor chip that the data input/output control device is formed.

23. A semiconductor memory device system comprising:
a nonvolatile semiconductor memory device; and
a data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device,
wherein the data input/output control device comprising:
a data correction input/output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; an error detecting unit configured to read input data sequentially in the stored code length for execution and detect number of erroneous data in the read n (n is an integer greater than or equal to 1) pieces of data using the predetermined error correcting code; and a memory processing unit configured to store length of data that is longer than the data length for execution as the data length for execution in the error correction information memory unit and code length of the predetermined error correcting code as the code length for execution in the error correction information memory unit, the length of data and the code length of the predetermined error correcting code correcting and detecting more errors than an upper limit number of errors that is correctable and detectable using one predetermined error correcting code with the code length for execution when the detected number of erroneous data exceeds a predefined upper limit number of errors; and
a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit, and the data output from the decoding unit of the data correction input/output circuit is output to the host device when a read out request signal requesting to read out data stored in the semiconductor memory device is input from the host device, and control the data correction input/output circuit and the semiconductor memory device such that the data stored in the semiconductor memory device is read out to be erased after the data read out is input into the error detection unit of the data correction input/output circuit when an erase request signal requesting to erase data stored in the semiconductor memory device is input from the host device.

24. A semiconductor memory device system comprising:
a nonvolatile semiconductor memory device; and
a data input/output control device configured to encode data input from a host device into predetermined error correcting code to store the encoded data in a nonvolatile semiconductor memory device, input the stored data in the nonvolatile semiconductor memory device, perform error correction and decoding on input data using the predetermined error correcting code, and output the decoded data to the host device,
wherein the data input/output control device comprising:
a counting number of write times circuit configured to count number of write-erase times that is a sum of number of times writing data to the semiconductor memory device and number of times erasing data stored in the semiconductor memory device;
a data correction input and output circuit having: an error correction information memory unit storing data length for execution and code length for execution, the data length for execution being length of data encoded into the predetermined error correcting code, the code length for execution being length of the predetermined error correcting; an encoding unit configured to read input data sequentially in the stored data length for execution, encode the read data into the predetermined error correcting code having the code length for execution, and output the encoded data to the semiconductor memory device; a decoding unit configured to read input data sequentially in the stored data length for execution, perform error correction and decoding on the read data using the predetermined error correcting code, and output the decoded data to the host device; and a memory processing unit configured to store length of data as the data length for execution in the error correction information memory unit and code length of the predetermined error correcting code as the code length for execution in the error correction information when the counted number of write and erase times exceeds a threshold for judgment assumed that more errors than the predefined upper limit number of errors are generated in n (n is an integer greater than or equal to 1) pieces of data having the code length for execution, the length of data and the code length of the predetermined error correcting code configured to detect and correct more errors than an upper limit number of errors that is corrected detected using one predetermined error correcting code having the code length for execution; and a control circuit configured to control the data correction input/output circuit and the semiconductor memory device such that data input from the host device is input into the encoding unit of the data correction input/output circuit and the data output from the encoding unit of the data correction input/output circuit is output to be stored in the semiconductor memory device when a write request signal requesting to write data to the semiconductor memory device is input from the host device, control the data correction input/output circuit and the semiconductor memory device such that the data stored in the semiconductor device is read out to be input into the decoding unit of the data correction input/output circuit and the data output from the decoding unit of the data correction input/output circuit is output to the host device when a read out request signal requesting to read out data stored in the semiconductor memory device is input from the host device, and control the semiconductor memory device such that the data stored in the semiconductor memory device is erased when an erase request signal requesting to erase data stored in the semiconductor memory device is input from the host device.

* * * * *